INVENTOR
JACK SAUL CUBERT
BY Griffin and Stokes
ATTORNEYS 3,165,641
Patented Jan. 12, 1965

3,165,641

PLURAL LOGIC CIRCUIT UTILIZING BREAKDOWN DIODES TO IMPROVE WAVE SHAPE AND SWITCHING SPEEDS

Jack Saul Cubert, Haddonfield, N.J., assignor to Sperry Rand Corporation, New York, N.Y., a corporation of Delaware Filed July 20, 1961, Ser. No. 125,473
25 Claims. (Cl. 307—88.5)

This invention relates to novel logical circuits, and more particularly, to circuits utilizing solid state components including reverse-biased semiconductor devices operating in their breakdown region.

Logical circuits such as AND gates and OR gates, and combinations thereof, are extensively used in data processing equipment and the like for manipulating signals during both arithmetic and control operations. When a high pulse repetition rate is desired for purposes of rapidly performing these operations in such equipment, the response time of such logical circuits must be fast so that there is little or no delay incurred therein between the application of input signals and the generation of an output signal therefrom. Furthermore, as in all data processing equipment, the reliability of the components therein is a prime requisite, together with the desideratum of low power consumption within the circuit.

The present invention provides all three of the above advantages by utilizing solid state components arranged in novel configurations and including semiconductor devices having reverse breakdown potential characteristics for purposes of obtaining greater efficiency and a high speed response to the application of input signals. Two commonly used species of logical combination circuits are illustrated, one being a configuration of OR-AND-OR gates connected in tandem, while the other is a combination of AND-AND-OR gates also connected in tandem. Each of the OR and AND gates utilizes one or more semiconductor devices, such as breakdown diodes, each having a reverse breakdown potential characteristic such that the application thereacross of certain potential in its reverse (or high resistance direction) causes the breakdown of a rectifying junction therein and permits a substantially large current to flow therethrough with the potential drop thereacross remaining relatively constant. The initiation of breakdown operation in such a device, as well as the extinguishing of same, is extremely rapid and is utilized in the present invention during a switching operation to detect the time relationship of one or more input signals. The AND gate per se, which is used in the logical circuit combinations of the present invention, is shown and claimed in a copending application U.S. Serial No. 125,521, filed by Shao C. Feng on July 20, 1961.

Therefore, an object of the present invention is to provide a logical circuit comprising a combination of AND and OR gates, each utilizing one or more reverse-biased semiconductor breakdown devices operating in their breakdown condition.

Another object of the present invention is to provide a logical OR-AND-OR multi-layer logic circuit which has an extremely short time delay therein between the application of input signals thereto and the generation of an output signal therefrom.

A further object of the present invention is to provide an AND-AND-OR multi-layer logic circuit having an extremely short time delay therein between the application of input signals thereto and the generation of an output signal therefrom.

Another object of the present invention is to provide a multi-layer logic circuit combination which includes an AND-OR gate configuration, wherein each of the gates includes semiconductor devices in their reverse-biased state and operating in a breakdown condition at various times.

These and other objects of the present invention will become apparent during the course of the following description, which is to be taken in conjunction with the drawings, in which.

Figure 6A:
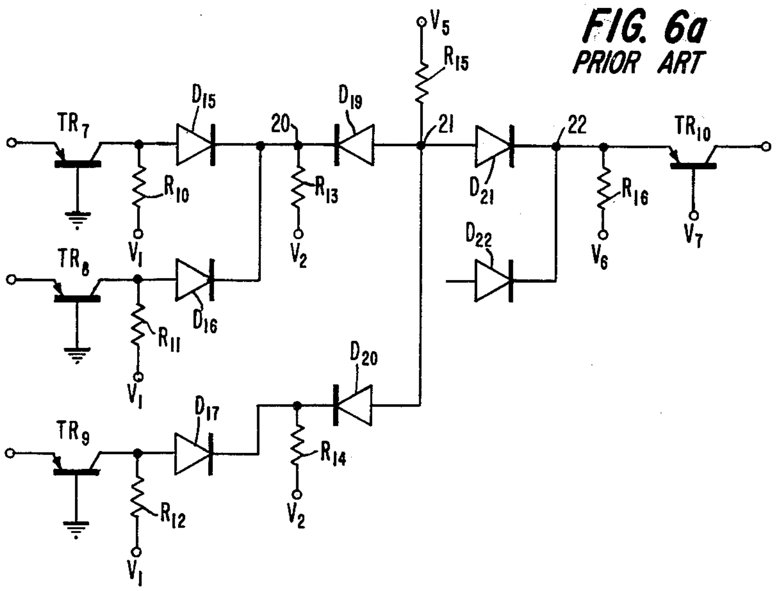
Figure 6B:
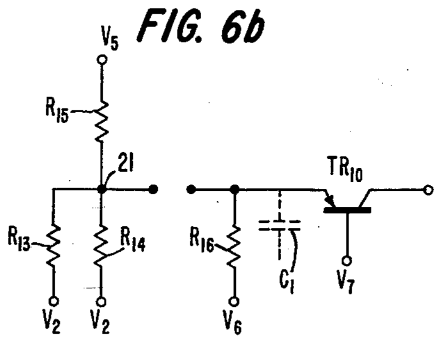
Figure 6C:
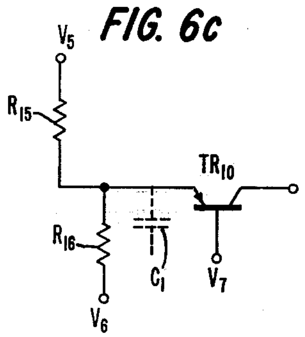
Figure 7:
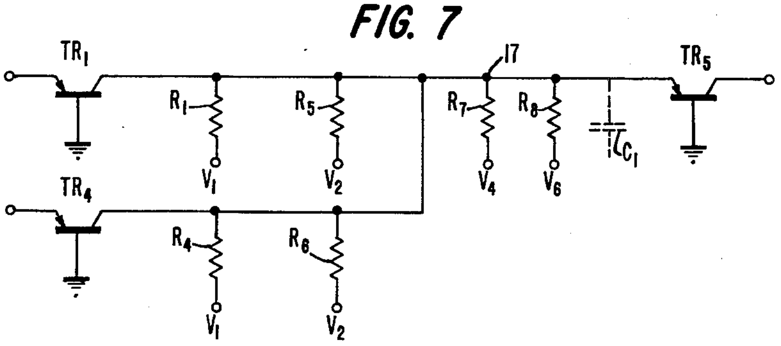

FIGURES 6*a*, 6*b* and 6*c* show an OR-AND-OR logical circuit of the prior art together with equivalent circuits thereof; and FIGURE 7 shows an equivalent circuit of the OR-AND-OR logic of the present invention.

Figure 1:
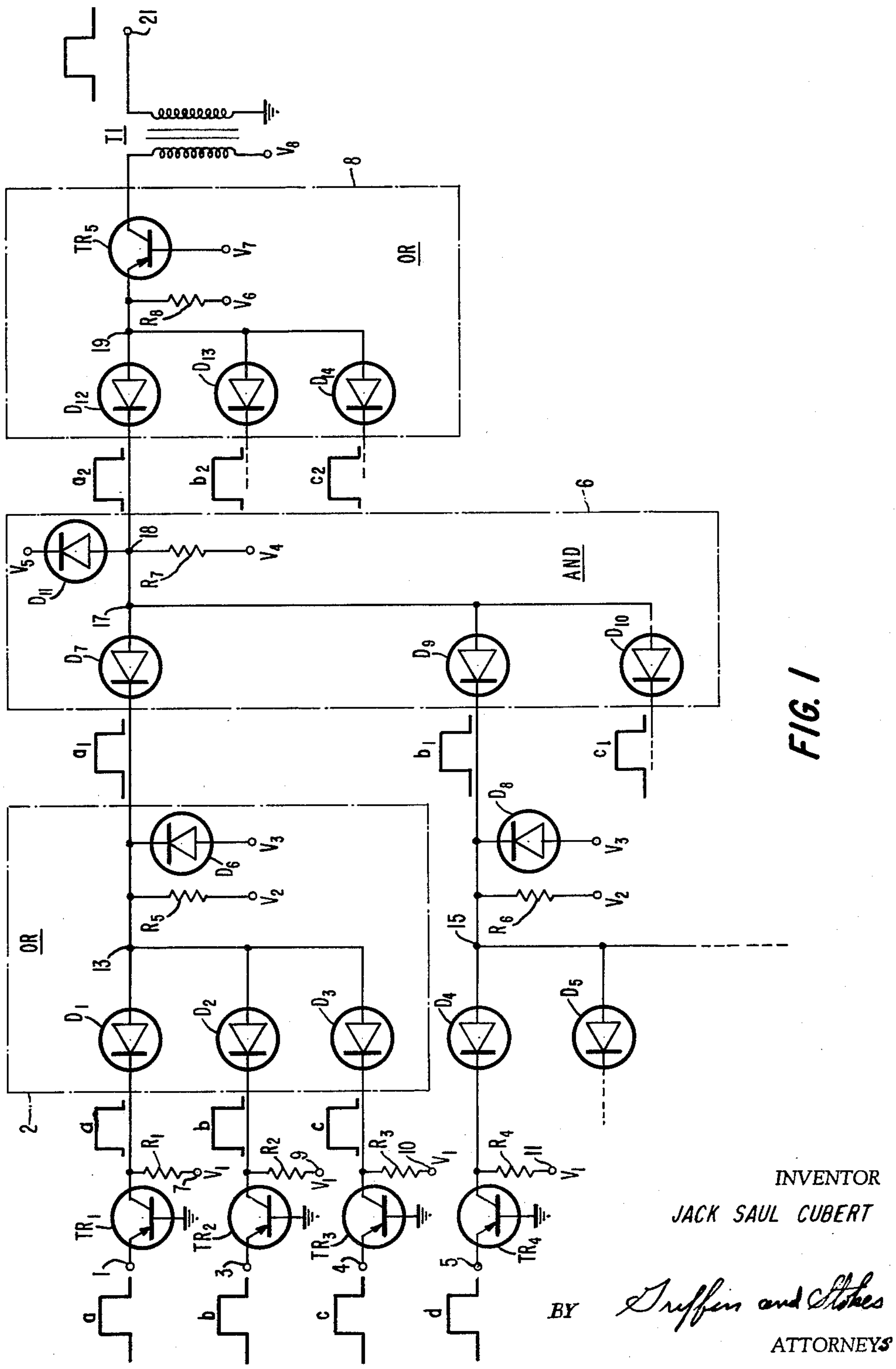
FIGURE 1 shows one embodiment of the invention comprising a logic circuit combination of OR-AND-OR gates connected in tandem.

FIGURE 1 will first be described and its operation explained in conjunction with FIGURES 3 and 4. In FIGURE 1, one embodiment of the invention is disclosed which is that of a multi-layer OR-AND-OR logical gate configuration to which a plurality of input signals *a, b, c, d,* etc. may be applied, and from which appears an output signal on terminal 21 depending upon the sequence and combination of said input signals.

It would appear to be advantageous to commence the description of FIGURE 1 by referring first to the last, or output logical gate, from which the output signal appears. This logical gate is composed of a number of components which are enclosed by the dot-dash line 8 and which perform a logical OR function. After generally describing the operation of OR gate 8, the means for providing inputs thereto will be discussed, which said means include an AND gate consisting of components enclosed by the dot-dash line 6. The discussion will conclude with a description of a typical input to AND gate 6, which may be a third layer OR gate consisting of components enclosed by dot-dash line 2. It is to this OR gate 2 that the input signals *a, b,* and *c* are applied.

The output OR gate of FIGURE 1 is comprised of components enclosed by dot-dash line 8 as above mentioned. As shown in FIGURE 1, OR gate 8 has three input terminals thereto to which signals $a_2$, $b_2$, and $c_2$ may be applied. A group of semiconductor devices $D_{12}$, $D_{13}$ and $D_{14}$ are connected between each of the input terminals and a common junction 19, which has also associated therewith a transistor $TR_5$ whose emitter electrode is connected to junction 19. Transistor $TR_5$ is of the P-N-P type as shown in FIGURE 1, and its base electrode is connected to a source of biasing potential $V_7$, while its collector electrode is connected with any type of output load impedance such as the primary winding of a transformer $T_1$. Also connected to junction 19 is a resistor $R_8$ to which is applied another biasing potential $V_6$. In the absence of current flow through any of the devices $D_{12}$ through $D_{14}$, the potentials $V_6$ and $V_7$ are such that the emitter of transistor $TR_5$ has a potential lower than its base and is thereby turned off. This means that there is substantially no current flowing in its collector circuit through the primary load winding.

As shown in FIGURE 1, the devices $D_{12}$ through $D_{14}$ are semiconductor diodes having their anodes connected to junction 19 and their cathodes connected to the input terminals of OR gate 8 so as to receive the signals $a_2$ through $c_2$. In these diodes, the forward and reverse V–I characteristics are asymetrical. When the anode of a diode is higher in potential than its cathode (forward biased), only a small resistance is encountered to conventional current flow therethrough from anode to cathode. However, when the cathode is higher in potential than the anode (reverse biased), an extremely high resistance is normally presented to conventional current flow therethrough from cathode to anode such that an effective open circuit is created therebetween. These conditions may be seen in FIGURE 3, which shows the V–I characteristics in both the forward and reverse directions of a semiconductor diode such as is utilized in the present invention. However, the devices used herein have a further characteristic in that the application of a reverse potential difference $V_B$ causes a breakdown of the rectifying junction which allows a substantially large current to flow therein. When breakdown occurs, the reverse resistance of the device suddenly becomes much less than before, and the potential difference across the anode-cathode junction remains relatively constant at $V_B$ no matter what the magnitude of current flowing therethrough. The well known avalanche breakdown exhibits this characteristic. The breakdown of the junction is temporary, and exists only so long as the potential $V_B$ maintained thereacross. As soon as the reverse potential falls below the critical magnitude $V_B$, the breakdown operation of the device is extinguished which causes it to revert to its high reverse resistance region. Such diodes are well-known in the semiconductor art and may, for example, be silicon breakdown diodes. The present invention may also utilize devices other than diodes, if such devices exhibit a reverse breakdown characteristic between two terminals thereof of the kind above described.

The initiation of breakdown operation in such a semiconductor device, together with the extinguishment thereof, is extremely rapid and on the order of $10^{-10}$ microseconds. This characteristic is utilized throughout the present invention to provide a rapid response to input signals applied thereto in order to create ideal step-voltage waveforms. For example, in the absence of any of the input signals $a_2$, $b_2$, or $c_2$ to OR gate 8, the diodes $D_{12}$, $D_{13}$, and $D_{14}$ are each operating in their high resistance region such that substantially no current flows therethrough to junction 19. Thus, inasmuch as these diodes effectively present an open circuit between junction 19 and the input terminals to OR gate 8, the potential of junction 19 is approximately equal to potential $V_6$. As noted previously, the emitter-base junction of transistor $TR_5$ is reverse-biased by virtue of the relative magnitudes and polarities of potentials $V_6$ and $V_7$. In this state, transistor $TR_5$ has substantially no emitter current flowing therein which results in little or no current flow in the collector circuit which includes the primary winding of transformer $T_1$. The other terminal of the primary winding is connected to a potential $V_8$ such that the base-collector junction of transistor $TR_5$ is also permanently biased in the reverse direction.

Upon application of an input signal to one of the diodes $D_{12}$ through $D_{14}$, its potential is such as to cause the device to commence operation in its reverse breakdown region so that the potential difference thereacross is equal to the breakdown potential $B_B$. Thereupon, the device $D_{12}$ exhibits an only small resistance to the current flow in the reverse direction therethrough, such that conventional current flows from the cathode of the diode to the anode at junction 19 back through resistor $R_8$ to the potention $V_6$. For example, assume that signal $a_2$ is applied to the cathode of device $D_{12}$, having a magnitude such that the cathode bias potential is sufficiently higher than the anode to cause breakdown. A potential difference of $V_B$ can be maintained across $D_{12}$ as long as signal $a_2$ is applied thereto. A substantial current flows therethrough from the cathode to the anode and back to potential $V_6$ through resistor $R_8$. A flow of current in resistor $R_8$ from junction 19 to potential $V_6$ raises the potential of junction 19. The base biasing potential $V_7$ of $TR_5$ is adjusted such that the raised potential of junction 19 causes the emitter-base junction of $TR_5$ to be forward biased. This turns on $TR_5$ and causes current flow in the collector circuit of $TR_5$ in a direction from the collector through primary winding of $T_1$ back to potential $V_8$. The voltage induced in the secondary winding, upon initiation of current flow in the primary winding, causes a first pulse to appear at terminal 21, which may have a positive polarity as shown. When the input signal $a_2$ disappears from the cathode of $D_{12}$, the breakdown operation of $D_{12}$ is extinguished, and the diode reverts to its high resistance region such that current therethrough substantially ceases. The potential at junction 19 reverts to a magnitude such as to again turn off $TR_5$. This discontinues current flow in its collector such that a second pulse of opposite polarity is now induced in the secondary winding of transformer $T_1$. Obviously, the collector of $TR_5$ may be connected to a resistive load instead of to the primary winding of a transformer, across which an output signal may be obtained which is maintained as long as $TR_5$ is in its conducting state.

In like fashion, the occurence of either signals $b_2$ or signal $c_2$ at the cathodes of respective devices $D_{13}$ or $D_{14}$ will cause breakdown and conduction therethrough to generate an output signal from transistor $TR_5$.

If two or more of the input signals are applied to the diodes, a breakdown of each will occur, but an output signal will still be generated from the transistor. As before noted, the initiation of reverse breakdown operation of any of the diodes $D_{12}$ through $D_{14}$ is extremely rapid and results in an almost ideal step voltage waveform being applied to the emitter of $TR_5$.

The signals $a_2$ through $c_2$, which are applied to the inputs of OR gate 8, may be derived from any number of sources such as, for example, another logical gate. In the invention as shown, at least one of the input signals to the diodes in OR gate 8 is derived from a logical AND gate comprised of components enclosed by the dot-dash line 6. This is signal $a_2$, althought it is to be understood that each of the input signals $b_2$ and $c_2$, respectively applied to devices $D_{13}$ and $D_{14}$, may also be, if desired, generated from similar type AND gates. However, the novel concept of the present invention is not limited to such a configuration.

The AND gate circuit 6, as shown in FIGURE 1, is comprised of three input terminals to which are respectively connected the cathodes of semiconductor breakdown devices $D_7$, $D_9$, and $D_{10}$. Input signals $a_1$, $b_1$, and $c_1$ may be respectively applied thereto. The anodes of these three devices are connected to a common junction 17 which in turn is connected to the cathode of device $D_{12}$ in OR gate 8. Also connected to junction 17 by its anode is the device $D_{11}$ having its cathode connected to a source of potential $V_5$. A resistor $R_7$ has one terminal connected to junction 17 and the other connected to a source of potential $V_4$. The polarity of the potential applied across the series combination of $D_{11}$ and $R_7$, due to the sources $V_5$ and $V_4$, is such as to reverse bias device $D_{11}$ by maintaining its cathode at a potential higher than the anode.

In the absence of any of the input signals $a_1$, $b_1$, or $c_1$ to the cathodes of the respective devices $D_7$, $D_9$, and $D_{10}$, these devices are reverse biased, but offer an extremely high resistance to current flow in the reverse direction therethrough, so that each effectively constitutes an open circuit to isolate junction 17 from the effect of a potential at its cathode. The magnitude of the potential applied across the series combination of $D_{11}$ and $R_7$ is such to exceed the breakdown voltage $V_B$ of $D_{11}$ and cause it to conduct current in the reverse direction from potential $V_5$ through $D_{11}$ and resistor $R_7$ to potential $V_4$. The magnitude of the current through $D_{11}$, in the absence of any input signals $a_1$, $b_1$ or $c_1$, may be represented by the symbol $I_D$ as shown in FIGURE 4. The current $I_D$ also flows through resistor $R_7$ and generates a potential $V_E$ (measured from $V_4$) at junction 17 which, when applied to the cathode of diode $D_{12}$, does not raise the cathode sufficiently to initiate breakdown operation. The potential $V_E$ can therefore be considered as the reference level present at $D_{12}$ denoting the absence of a positive going signal $a_2$.

The voltage drop across diode $D_{11}$, when it is operating in its breakdown condition, remains relatively constant at $V_B$. Thus, the potential difference across the series combination of $D_{11}$ and $R_7$ is equal to the sum of $V_E$ and $V_B$, and cannot change. If the potential at junction 17 increases above the value of $V_E$, then $D_{11}$ will cease operating in its breakdown region because the breakdown voltage $V_B$ cannot be maintained thereacross. Upon application of a single input signal thereto, for example $a_1$, the potential difference across the cathode-anode junction of $D_7$ is raised above its critical breakdown voltage $V_B$ such that $D_7$ breaks down and thereafter offers a small resistance to current flow therethrough in the reverse direction. The current which flows from cathode to anode of $D_7$, to junction 17, and through $R_7$ to voltage $V_4$ is of magnitude I. In like fashion, if a single input signal $b_1$ is instead applied to the cathode of $D_9$, this device too will operate in its breakdown region to pass a current of magnitude I therethrough in the reverse direction, which is applied to junction 17 and flows through resistor $R_7$. Again, if but the single input signal $c_1$ is instead applied to the AND gate 6, a current of magnitude I is applied to junction 17 via device $D_{10}$. The current of magnitude $I_D$, which flows through the series combination of $D_{11}$ and $R_7$ in the absence of any input signals to AND gate 6, is adjusted to equal a magnitude 2I. The conduction of any one of the devices $D_7$, $D_9$, or $D_{10}$ will thereby reduce the current flowing through device $D_{11}$ by a magnitude, I, but will still maintain a current of magnitude 2I in resistor $R_7$. For example, if a signal $a_1$ is applied to the cathode of $D_7$, the current flowing through $R_7$ is of a magnitude 2I and is formed by the summation at junction 17 of equal currents I contributed via $D_{11}$ and $D_7$. In such a situation, the potential $V_E$ at junction 17 is maintained because the total current 2I through $R_7$ does not vary from that present when no inputs are applied to AND gate 6. In like fashion, if only signal $b_2$ is applied to device $D_9$, the current flow 2I through device $D_{11}$ is reduced in magnitude I, but the total current flow through resistor $R_7$ remains at value 2I because of the I current now provided by $D_9$. Similar results follow in the event that a signal only $c_1$ is applied to AND gate 6.

In the event that two out of the three input signals $a_1$, $b_1$, or $c_1$ are applied to AND gate 6, then two of the devices $D_7$, $D_9$, or $D_{10}$ will operate in their breakdown region, with each passing therethrough a current of magnitude I. These currents are summed at junction 17 and applied to resistor $R_7$. In so doing, current flow through diode $D_{11}$ ceases, because any current contributed by it to that in $R_7$ would raise the potential at junction 17 above the value $V_E$, which in turn would prevent the maintenance of the breakdown potential $V_B$ across $D_{11}$. Thus, $D_{11}$ effectively returns to its cut off or high resistance region. However, the total current flow through resistor $R_7$ remains of magnitude 2I because of the equal current I contributions from the two input diodes which have signals applied thereto. Therefore, it may be seen that a potential $V_E$ exists at junction 17 for 0, 1, or 2 inputs to AND gate 6. Therefore, the cathode of device $D_{12}$ in OR gate 8 is not raised to a level causing breakdown thereof.

If all three input signals $a_1$, $b_1$, and $c_1$ are applied to the breakdown devices in AND gate 6, each device operates in its breakdown region and passes a current therethrough, with these currents being summed at junction 17 and applied through resistor $R_7$ to potential $V_4$. The sum of the three currents passing through devices $D_7$, $D_9$, and $D_{10}$ is such that the total current flowing through $R_7$ is greater than the previous current of magnitude 2I. This means, therefore, that the potential at junction 17 is increased above the value $V_E$, which is that existing when less than the full number of input signals are applied to the AND gate. This increased potential at junction 17 may be represented by $V_E'$ and is sufficient to breakdown diode $D_{12}$ in the manner hereinbefore described. Because $D_{11}$ is driven to its cut-off region by the application of two or three of the input signals, it effectively disconnects junction 17 from potential $V_5$. The magnitude of signal $a_2$ is seen to be $V_E'$-$V_E$.

The number of input terminals to AND gate 6 may be expanded to any desired number N. In so doing, the following criteria are necessary in order that this circuit operate in the manner previously described. The maximum current $I_D$ flowing through device $D_{11}$, when operating in its breakdown region and in the absence of any input signals, should be adjusted so that it is equal to a magnitude $(N-1)$I, where I is equal to the current contributed by any of the input semiconductor devices which has an input signal thereto. The application of any number of input signals from zero up to $N-2$ will maintain $D_{11}$ in its reverse breakdown region. A number of input signals $N-1$ or N will drive diode $D_{11}$ into its cut-off region and extinguish its breakdown operation. However, the application of any number of inputs up to and including $N-1$ does not affect the magnitude of the total current flowing through resistor $R_7$, and signal $a_2$ thereby will not be generated at junction 17.

Upon application of N input signals, the current contributed by each of the devices, when summed at junction 17, is such as to raise the potential thereat from $V_E$ to $V_E'$ in order to produce $a_2$.

Due to the breakdown characteristics of devices $D_8$, $D_9$, $D_{10}$, and $D_{11}$, AND gate 6 is capable of extremely rapid operation, because the transition from operation in a breakdown region into that of a high resistance or cut-off region, or vice versa, is almost instantaneous.

The input signals $a_1$, $b_1$, and $c_1$ which are applied to AND gate 6 may be derived from any number of sources, including another logical circuit. In the embodiment of FIGURE 1, one such logical circuit for the generation of $a_1$ is shown to be an OR gate comprised of components enclosed by the dot-dash line 2. Although each of the input signals $a_1$, $b_1$ and $c_1$ may be produced by similar OR gates, it is not necessary for purposes of this invention that this be so.

OR gate 2 in FIGURE 1 is shown comprised of three input semiconductor breakdown devices $D_1$, $D_2$, and $D_3$, each of which receives an input signal at its cathode and whose anode is connected at common junction 13. A resistor $R_5$, having one terminal connected to junction 13, is used through which a bias potential $V_2$ is applied. Another semiconductor breakdown device $D_6$ is connected with its cathode to junction 13 and its anode to a further source of potential $V_3$. Junction 13 is connected to the cathode of a corresponding device $D_7$ in AND gate 6 so as to apply the signal $a$ thereto when any one of the input signals $a$, $b$, or $c$ is applied to the devices $D_1$ through $D_3$.

The operation of OR gate 2 is similar to that of OR gate 8. For example, in the absence of any input signals $a$, $b$, or $c$ to the cathodes of $D_1$, $D_2$, or $D_3$, these devices are in their cut-off region and so present a high resistance to reverse current flow from cathode to anode. In this event, substantially no current flows through resistor $R_5$ so that junction 13 is a potential $V_2$ which is calculated to maintain associated device $D_7$ in its cut-off region. Therefore, in the absence of an input $a$, $b$, or $c$, no signal $a_1$ is generated at terminal 13. In the event that any one of the input signals is applied to OR gate 2, for example signal $a$, device $D_1$ is driven into its breakdown condition such that a current flows thereacross and through resistor $R_5$ to potential $V_2$. This current flow through $R_5$ may be considered to have magnitude $I_O$. The potential at junction 13 is thereby raised and represents the signal $a_1$, which is utilized to drive diode $D_7$ into its breakdown condition. In like manner, the application of either the signals *b* or *c* to respective devices $D_2$ or $D_3$ will generate the output signal $a_1$ from OR gate 2.

In the event that two or more input signals *a, b,* or *c* are applied to OR gate 2, two or more of the devices $D_1$, $D_2$ or $D_3$ will operate in their breakdown condition with each passing current therethrough. These currents are summed together at junction 13. Inasmuch as the signal $a_1$ should have one fixed potential so that the current through $D_7$ will be of constant magnitude I, it may prove necessary to provide a voltage clamp of some sort so that the maximum current in $R_5$ cannot exceed $I_O$. Semiconductor device $D_6$ provides this function, and potential $V_3$ is adjusted such that the device $D_6$ operates in its reverse breakdown condition whenever the potential at junction 13 rises due to the actuation of one or more of the input devices $D_1$, $D_2$, or $D_3$. This means, therefore, that the potential at junction 13 is clamped to a specific maximum value because of the constant voltage drop across device $D_6$ in its breakdown condition. Therefore, if the three input signals *a, b,* and *c* are simultaneously applied to OR gate 2, the maximum current flow through resistor $R_5$ is of value $I_O$, and all current at junction 13 in excess of this value and value I is returned to potential $V_3$ via the device $D_6$. Therefore, the maximum value of current flowing through device $D_7$ in its breakdown condition is I such that the operation of AND circuit 6 is independent of the number of input signals applied to OR gate 2. Obviously, OR gate 2 may be provided with any number of input terminals and is not limited to the specific number shown in FIGURE 1.

The input signals *a, b,* and *c* may be produced by any number of means, among which are a plurality of transistors $TR_1$, $TR_2$, and $TR_3$ connected as shown in FIGURE 1. These transistors are of the P-N-P type with each having its collector electrode connected to a respective cathode of the devices $D_1$, $D_2$ and $D_3$, and to a respective load resistor $R_1$ through $R_3$ so as to reverse bias the base collector junction of each transistor. Input signals *a, b,* and *c* may be applied to the emitter electrodes of these transistors in order to initiate conduction in their respective collector circuits so that a collector potential is raised due to current flowing through the respective load resistors $R_1$, $R_2$, and $R_3$.

The over-all operation of the logic circuit of FIGURE 1 will now be described with particular reference to FIGURE 4. In FIGURE 4, the idealized current wave forms through many of the components shown in FIGURE 1 are presented as they exist timewise with respect to each other. Since many logical circuits in data processing systems operate on signals representing binary numbers, the signals *a*, $a_1$, $a_2$, etc. are represented as having a binary significance of either 0 or 1.

Figure 4:
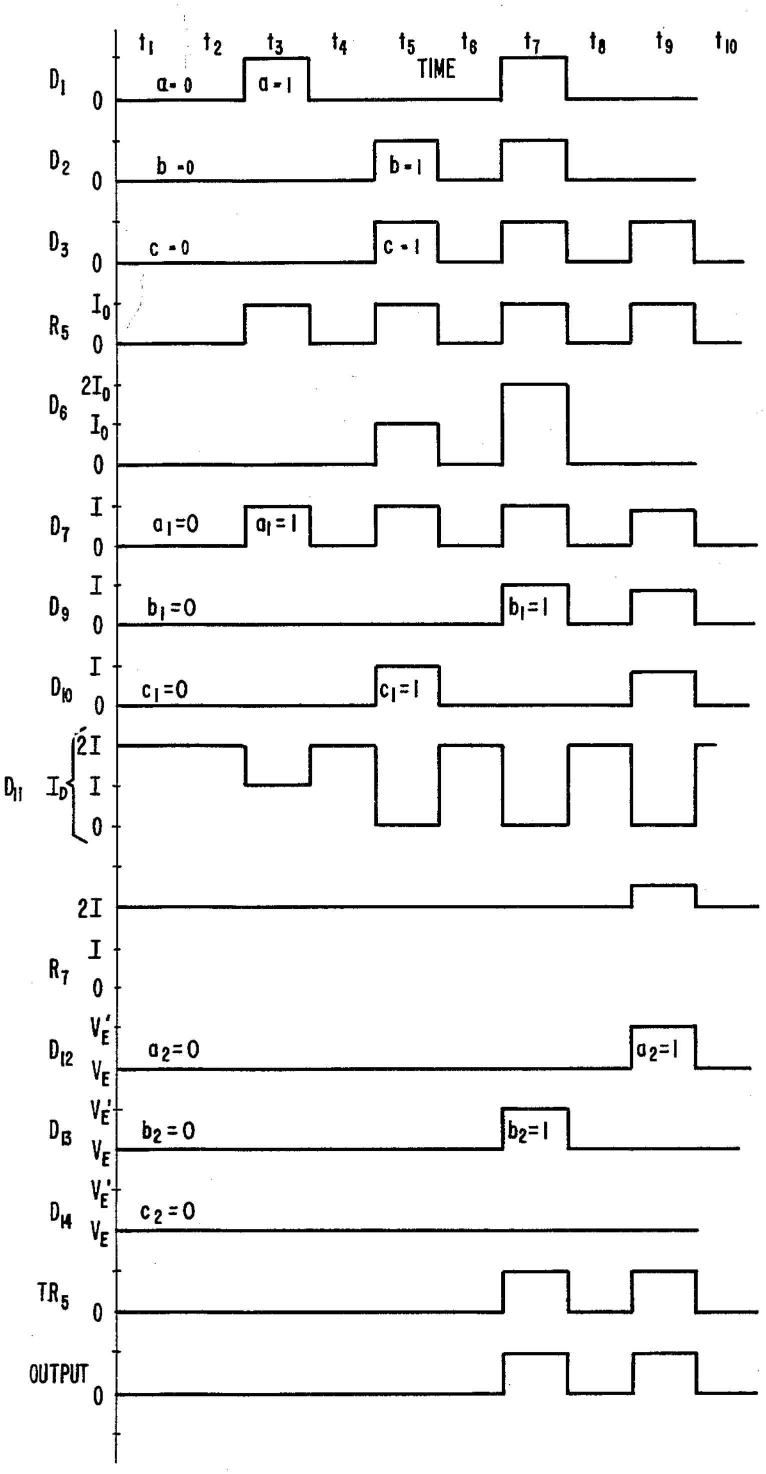
FIGURE 4 illustrates certain current and potential wave forms occurring within the circuit of FIGURE 1.

First, assume that a signal applied to OR gate 2 via the input transistors occurs during a time period $t_3$ as indicated in FIGURE 4. Further assume that this is signal *a* applied to terminal 1 of transistor $TR_1$, which almost immediately appears as signal *a* on the collector and is applied to the cathode of device $D_1$. $D_1$ will thereby operate in its reverse breakdown condition and pass a current therethrough which is applied to junction 13 and causes a current flow of magnitude $I_O$ through resistor $R_5$. This raises the potential at junction 13 and causes device $D_7$ in AND gate 6 to pass a current of magnitude I therethrough to junction 17. Prior to the breakdown of device $D_7$, it is observed that the current flowing through device $D_{11}$, and consequently through resistor $R_7$, is of magnitude 2I. However, upon breakdown of device $D_7$, the current through device $D_{11}$ is reduced from value 2I to a value I as indicated in FIGURE 4. The total current flowing through resistor $R_7$, however, remains at value 2I so that the signal $a_2$ is not generated at junction 17. It is further assumed during time interval $t_3$ that signals $b_1$ and $c_1$ are not applied to the devices $D_9$ and $D_{10}$. Because no signal $a_2$ is generated from AND gate 6, diode $D_{12}$ remains in its cut-off region. It is further assumed during this time that signals $b_2$ and $c_2$ are also absent, so that no output appears from $TR_5$ or from the secondary winding of transformer $T_1$.

The next time interval of interest in FIGURE 4 is that designated $t_5$ where signals *b* and *c* are assumed to be applied to OR gate 2. In this event, both $D_2$ and $D_3$ operate in their breakdown region and conduct current therethrough which is summed at junction 13. However, due to the breakdown of device $D_6$, only current of magnitude $I_O$ flows through resistor $R_5$ so as to generate the signal $a_1$ having a fixed potential. Because the signal $a_1$ is generated, device $D_7$ operates in its breakdown region to pass a current of magnitude I therethrough to junction 17. It is also assumed at this time that a signal $c_1$ is applied to the cathode of device $D_{10}$ by means not shown, but which may be an OR gate like that of OR gate 2. The application of signal $c_1$ to device $D_{10}$ causes its breakdown such that each device $D_7$ and $D_{10}$ passes a current of magnitude I therethrough, which currents are summed at junction 17 and returned to potential $V_4$ via resistor $R_7$. This results in the cutting off of device $D_{11}$. Therefore, as noted in FIGURE 4, the current through device $D_{11}$ becomes 0 while the total current flow through resistor $R_7$ remains at value 2I. Signal $a_2$ is therefore not produced and diode $D_{12}$ remains in its cut-off region. It is assumed that at this time $t_5$, neither signals $b_2$ nor $c_2$ are applied to their respective diodes in OR gate 8. Consequently, no output signal is generated from terminal 21.

The next time interval of interest in FIGURE 4 is that designated by $t_7$. Assuming that all three signals *a, b,* and *c* are applied to OR gate 2, each of the diodes $D_1$, $D_2$, and $D_3$ conducts such as to generate signal $a_1$ at junction 13. The signal $a_1$ is applied to diode $D_7$, and it is further assumed that a signal $b_1$ is also applied to diode $D_9$. However, inasmuch as all three input signals $a_1$, $b_1$, and $c_1$ are not simultaneously applied to AND gate 6, no output signal $a_2$ is generated. If a signal $b_2$ is applied to device $D_{13}$ in OR gate 8, this device will conduct in the reverse direction so as to raise the emitter of transistor $TR_5$ and cause current flow in the collector circuit thereof which produces a positive going pulse at terminal 21. Upon termination of signal $b_2$, the device $D_{13}$ reverts to its cut-off region so as to interrupt current flow in the collector of $TR_5$ and thus generate a negative going pulse at terminal 21.

During time interval $t_9$, assume that a signal *c* is applied to device $D_3$ which results in signal $a_1$ being applied to AND circuit 6. Also, assume that signals $b_1$ and $c_1$ are applied to their respective devices $D_9$ and $D_{10}$ such that all three input signals are simultaneously applied to this AND gate. Since device $D_7$, $D_9$, and $D_{10}$ now conduct in a reverse direction, the sum of currents at junction 17 results in a current flow in $R_7$ of magnitude greater than 2I, which in turn raises the potential at junction 17 from $V_E$ to $V_E'$ and applies the signal $a_2$ to the cathode of $D_2$. This $a_2$ signal breaks down diode $D_{12}$ in OR gate 8 which thereby results in an output signal appearing at terminal 21 because of the conduction in transistor $TR_5$.

As before indicated, the present invention is not limited to the exact structure as shown in FIGURE 1. For example, OR gate 8 may have as many input terminals as desired. Furthermore, AND gate 6 may likewise have a varying number of input terminals, as may have OR gate 2. The invention also contemplates that the input signals applied to the input terminals of a logic circuit need not all be generated by similar type logic circuits. For example, signals $b_2$ and $c_2$ applied to devices $D_{13}$ and $D_{14}$ in FIGURE 1 may be provided by circuits other than AND gates, and in like fashion, the signals $b_1$ and $c_1$ applied to the input terminals of AND gate 6 may be provided by circuits other than OR gates. The novelty of the present invention is therefore seen to reside in a multi-layer logic circuit utilizing reverse biased breakdown devices, which circuits are connected in tandem and which have a fast response time.

It is also evident that the polarity of the semiconductor breakdown devices may be reversed from that shown in FIGURE 1 if the respective potentials applied thereto are also correspondingly reversed. For example, in AND gate 6 $D_{11}$ may be connected with its cathode to junction 17 the potential applied thereacross is such as to reverse bias the device. In such case, the devices $D_7$, $D_9$, and $D_{10}$ would be connected with their cathodes to junction 17 and appropriate potentials applied to their anodes so as to result in their selective breakdown operation. This procedure may be observed in each and every gate making up the circuit of FIGURE 1 without the exercise of invention by one skilled in the art. It also follows that the transistors may be of the N-P-N variety. They may further be connected such that input signals are applied to their base instead of their emitter electrodes.

The speed with which $TR_5$ responds to the step function voltage applied to its emitter depends upon many factors, such as its load impedance, inherent speed, and the operating conditions just prior to application of the input signal. With regard to the latter two factors, one important parameter to consider in the transient response time of a transistor is the emitter capacitance which must be charged by the step wave to a value such as to make the emitter higher in potential than the base. The time delay encountered in this operation depends upon the time constant of the capacitor charging circuit, which in turn is affected by the value of the impedance in said charging circuit. The present invention reduces this time constant by effectively lowering the value of the source impedance over that usually found in the typically prior art. In addition, this low impedance of the source also reduces the effective emitter capacitance since generally a high impedance circuit has sufficient inherent capacitance so as to make its operation slower than a circuit having a low impedance.

The above described advantages of the present invention are illustrated in FIGURES 6 and 7 of the drawings, which respectively show a typical prior art logical OR-AND-OR circuit, and the equivalent circuit of the present invention shown in FIGURE 1. Referring to FIGURE 6*a*, there is shown a logical OR-AND-OR circuit in which the functions are performed by diode logic. An input or gate is comprised of input transistors $TR_7$ and $TR_8$ having their collectors respectively connected to terminals of resistors $R_{10}$ and $R_{11}$. These resistors are biased by a voltage $V_1$. The collectors of $TR_7$ and $TR_8$ are also respectively connected via diodes $D_{15}$ and $D_{16}$ to a common junction 20 to which is also connected a biasing potential $V_2$ through resistor $R_{13}$. This combination of components comprises an input OR circuit whose operation will later be described. Common junction 20 is connected via a diode $D_{19}$ to a common junction 21 having also connected thereto a source of biasing potential $V_5$ via resistor $R_{15}$. Common junction 21 also has connected thereto a diode $D_{20}$ which has an input supplied thereto by a circuit comprised of components $TR_9$, diode $D_{17}$, and resistors $R_{12}$ and $R_{14}$. Diodes $D_{19}$ and $D_{20}$ are the input components of an AND gate which could have further inputs thereto if desired.

Junction 21 is connected via diode $D_{21}$ to a junction 22 which is also connected to a biasing resistor $R_{16}$ for the emitter of output transistor $TR_{10}$. In addition, a diode $D_{22}$ may also have an input applied thereto for purposes of forming a two input OR gate at the emitter input.

In operation, potential $V_5$ is higher than potential $V_2$ such that diodes $D_{19}$ and $D_{20}$ are forward biased in the absence of any signals to their respective input transistors. Thus, when no signal is applied to either of the input transistors $TR_7$ or $TR_8$, current in the positive direction flows through resistor $R_{15}$ and through $D_{19}$ and $R_{13}$ to $V_2$. In like fashion, in the absence of an input signal to transistors $TR_9$, current flows through a path consisting of $R_{15}$ and $R_{14}$. Under these conditions, common junction 21 in the AND gate is lower in potential than biasing potential $V_G$ connected to the emitter of the output transistor $TR_{10}$. The approximate equivalent circuit at this time is shown in FIGURE 6*b*, wherein it is seen that all of the input transistors are effectively disconnected from the circuit, and the emitter of $TR_{10}$ is disconnected from junction 21 due to the back biasing of diode $D_{21}$. FIGURE 6*b* further assumes that $D_{22}$ is also back biased. Because potential $V_6$ is lower in magnitude than $V_7$, the emitter is reverse biased such that no output current flows in the collector of $TR_{10}$. Furthermore, the upper plate of the emitter capacitance $C_1$ is held at this emitter potential.

Upon either one of the transistors $TR_7$ or $TR_8$ receiving an input signal thereto, current is initiated in its output collector which forward biases its respective diode $D_{15}$ or $D_{16}$ so as to raise the potential of junction 20 an amount sufficient to reverse bias $D_{19}$. Thus, the OR function of these components is observed, whereby resistor $R_{13}$ is disconnected from junction 21 by virtue of an input signal being received by either one or both of the transistors $TR_7$ and $TR_8$. The removal of $R_{13}$ from the circuit in FIGURE 6*b* is not sufficient to raise the potential of junction 21 and forward bias the emitter of $TR_{10}$. This action can only be performed if both diodes $D_{19}$ and $D_{20}$ are reverse biased. The latter condition is shown in the approximate equivalent circuit of FIGURE 6*c*, wherein it is seen that resistors $R_{13}$ and $R_{14}$ are effectively disconnected from input circuit to $TR_{10}$. However, the emitter voltage can not rise instantaneously because of the negative charge (with respect to $V_7$) held by capacitor $C_1$. A charging path for $C_1$ in this case includes resistor $R_{15}$ from source potential $V_5$, which means that a finite time delay is encountered before the emitter of $TR_{10}$ becomes forward biased.

FIGURE 7 shows the approximate equivalent circuit of the OR-AND-OR circuit comprising the present invention as shown in FIGURE 1. However, FIGURE 7 assumes, for purposes of simplicity, that AND gate 6 has only two input terminals thereto, with signals being applied only to input transistors $TR_1$, and $TR_4$. Upon signals being applied to these identified transistors, the control voltage $V_5$ in FIGURE 1 is disconnected from the $TR_5$ input circuit such that a charging path for the emitter capacitance $C_1$ is completed through input transistors $TR_1$ and $TR_4$. The only impedance in this charging circuit is that encountered within the transistor bodies themselves, which is normally lower than the impedance presented by $R_{15}$ in FIGURE 6C. Thus, the time constant of the emitter capacitance charging circuit is reduced by the novel configuration of the present invention, which thereby improves the response time of the output transistor to a step voltage waveform. The present invention therefore not only supplies an ideal stepwave input to the output transistor, it effectively reduces the impedance of the waveform source so as to lessen the time delay encountered between application of the input signal to $TR_5$ and the initiation of collector output current therefrom.

Figures 2, 3:
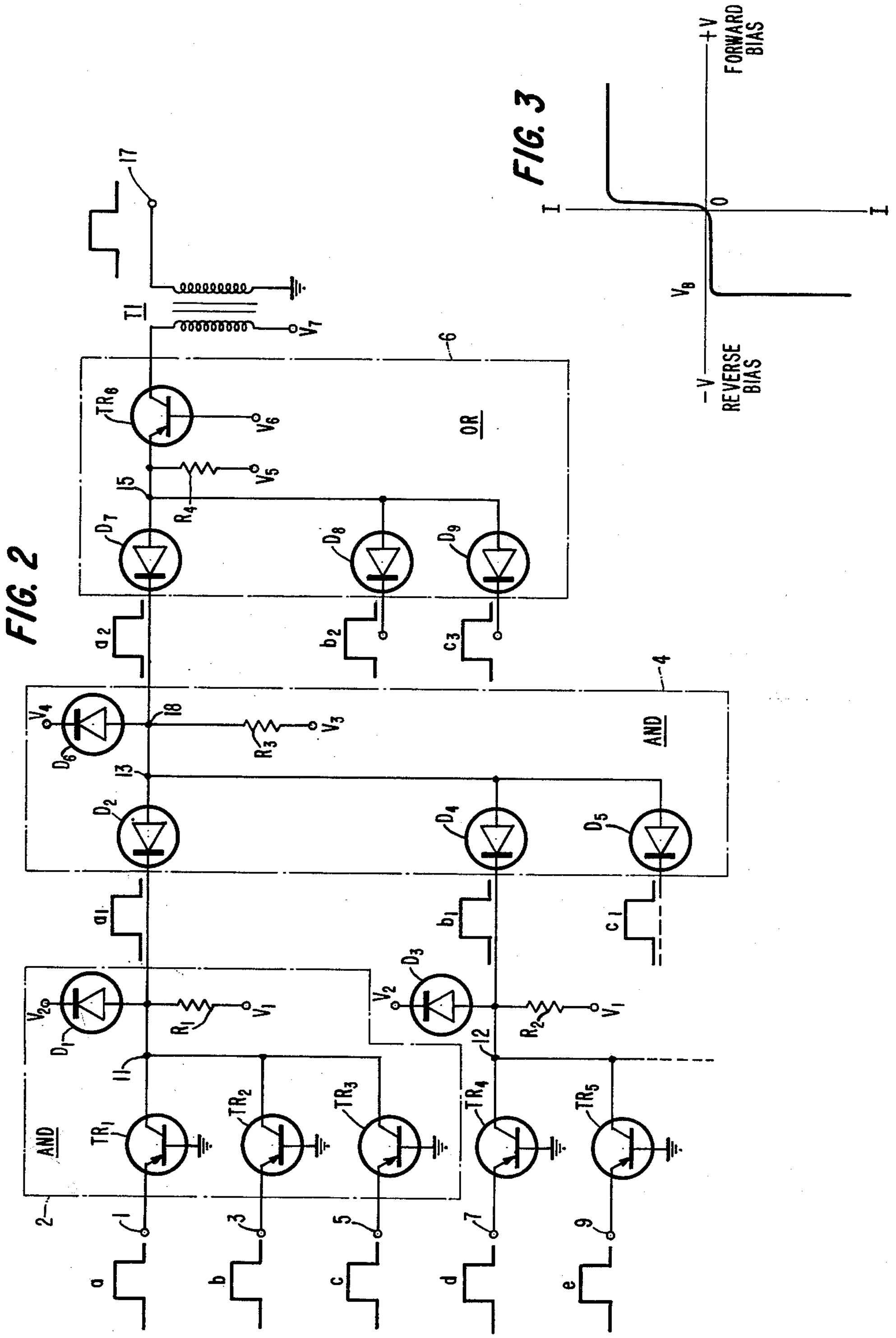
FIGURE 2 shows another embodiment of the invention comprising a logic circuit combination of AND-AND-OR gates connected in tandem.
FIGURE 3 shows the forward and reverse V–I characteristics of a semiconductor breakdown device of the kind described.

FIGURE 2 of the drawings discloses a second embodiment of the present invention in which the logic circuit, to which the signals *a*, *b*, *c*, etc. are applied, consists of an AND gate 2 instead of OR gate 2 such as is shown in FIGURE 1. The output OR gate 6, as well as the center AND gate 4, correspond in structure and operation to output OR gate 8 and AND gate 6 in FIGURE 1 of the drawings. For this reason, the structure and detailed operation of AND gate 4 and OR gate 6 in FIGURE 2 will not be described. The signals $a_1$, $b_1$, and $c_1$ which are applied to the inputs of AND gate 4 are derived from AND gate 2. It should, however, be emphasized that the present invention does not contemplate that all of the signals $a_1$, $b_1$, $c_1$, etc. be generated by AND circuits. In other words, only one or more of these signals may be produced by AND gates.

AND circuit 2 comprises a series of transistors $TR_1$, $TR_2$, and $TR_3$ having their collector electrodes connected in common to junction 11. Input signals *a*, *b*, and *c* are applied to their respective emitter electrodes. Their base electrodes may be connected to some suitable potential, for example, ground. AND circuit 2 also includes a device $D_1$ connected with its anode to junction 11 and its cathode to potential $V_2$. A resistor $R_1$ is likewise connected with one terminal to junction 11 and the other terminal to a potential $V_1$, such that the potential difference across the series combination of $D_1$ and $R_1$ has a polarity which reverse biases device $D_1$. The function of input transistors $TR_1$, $TR_2$, and $TR_3$ is to each provide a current of magnitude $I_F$ in its collector circuit upon application of an input signal *a*, *b*, or *c* to its respective emitter electrode. In the absence of the actuation of any of the transistors $TR_1$ through $TR_3$, the magnitude of the potential difference across the series circuit of $D_1$ and $R_1$ is such to drive a current of magnitude $I_E$ through $D_1$ and $R_1$, where $I_E=2I_F$. In the event that a number of input transistors equal to M are provided to junction 11, each transistor when actuated provides a current $I_F$ to junction 11. Then, the maximum magnitude of current through device $D_1$ is equal to $(M-1)I_F$.

Figure 5:
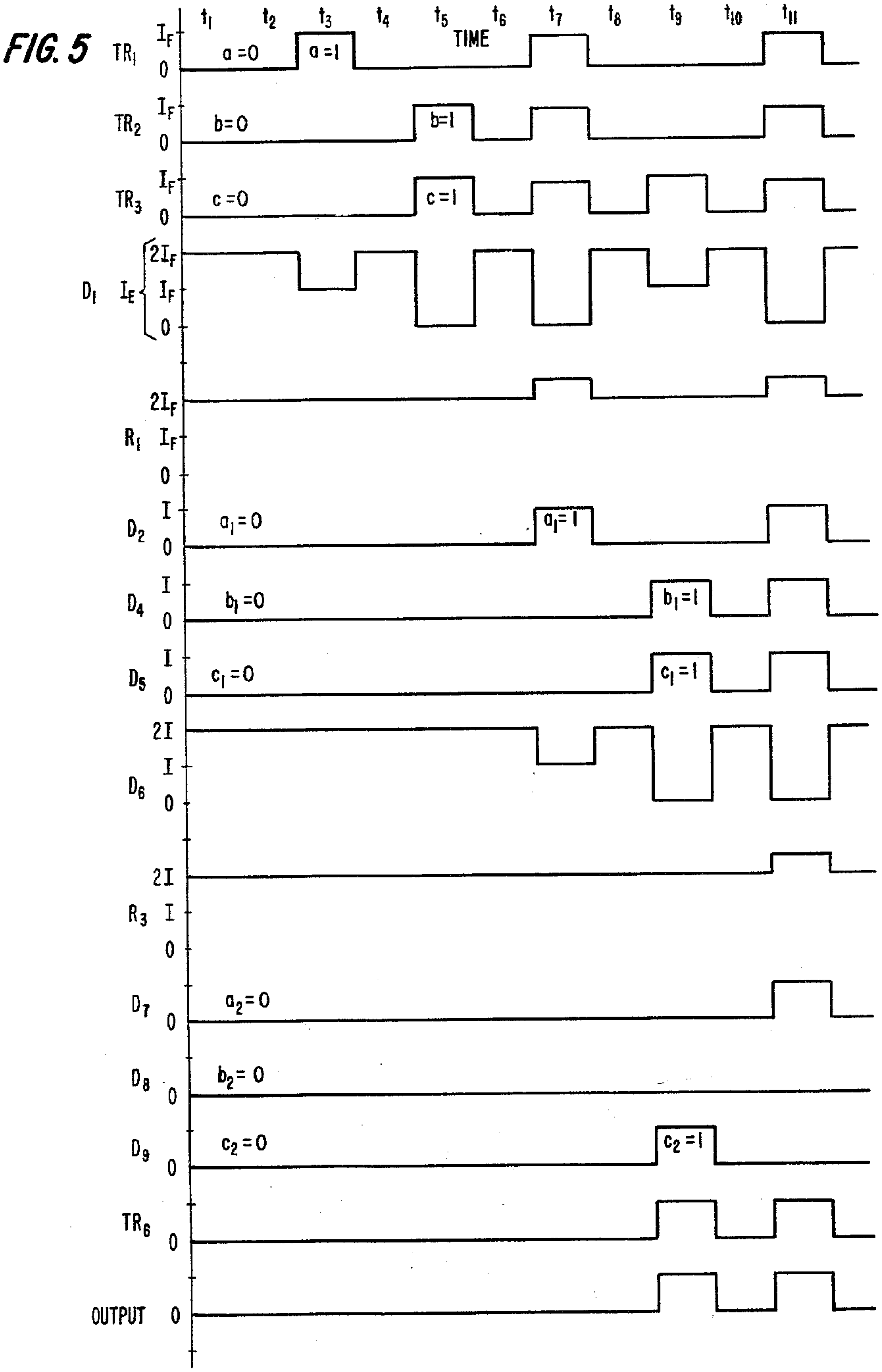
FIGURE 5 illustrates certain current and voltage wave forms occurring within the circuit of FIGURE 2.

The operation of AND circuit 2 of FIGURE 2 is similar to that of AND circuit 4 of the same figure. For example, in the event that only signal *a* is applied to transistor $TR_1$, a current of magnitude $I_F$ is provided therethrough to junction 11 which reduces the current flow through $D_1$ from a value $2I_F$ to $I_F$. However, the total current through resistor $R_1$ remains at value $2I_F$ so that there is no increase in potential at junction 11. Therefore, signal $a_1$ is considered to be absent. If two of the three input transistors $TR_1$, $TR_2$, or $TR_3$ are actuated by application of input signals, then the summation of the currents $I_F$ at junction 11 will maintain a total current of $2I_F$ through resistor $R_1$, but will effectively drive device $D_1$ into its cut-off region inasmuch as no current can flow therethrough. Upon actuation of all three input transistors, the summation of current at junction 11 results in a current of magnitude greater than $2I_F$ in resistor $R_1$ so that the potential of junction 11 is raised above its previous level and thus represents a signal $a_1$, which in turn is applied to one input of AND circuit 4. If signals $b_1$ and $c_1$ are simultaneously applied to their respective input devices $D_4$ and $D_5$, then an output $a_2$ will be generated at junction 18 such as to produce an output from terminal 17. The operation of the complete circuit of FIGURE 2 is thought obvious from a consideration of the waveforms in FIGURE 5.

As mentioned in connection with the circuit of FIGURE 1, the novelty of the invention shown in the embodiment of FIGURE 2 is not considered to reside merely in the structure as specifically shown therein. For example, each of the logical circuits 2, 4, and 6 in FIGURE 2 may have as many inputs as desired. Furthermore, each of the three logic levels in FIGURE 2 need not consist of the same type circuits. For example, input signals $b_1$ and $c_1$ may be produced by means other than an AND circuit. In like fashion, signals $b_2$ and $c_3$ may be produced by means other than an AND circuit. The novelty of the embodiment in FIGURE 2 is considered therefore to reside in the combination of three logical gates AND-AND-OR, each including semiconductor devices operating in their reverse breakdown condition to provide a fast response time for the logical circuit as a whole because of reasons similar to those given in connection with FIGURE 1. Also, as mentioned in connection with FIGURE 1, the polarity of the semiconductor breakdown devices in FIGURE 2 may be reversed as well as the potentials respectively applied thereto. The transistors may be of the N-P-N variety, and input signals thereto may be applied at their bases instead of their emitters.

Thus, many modifications and alterations to the preferred embodiments of FIGURE 1 and FIGURE 2 will become apparent to one skilled in the art without departing from the spirit of the invention as defined in the appended claims.

I claim:

1. A logic circuit including: a first OR circuit comprising a group of first semiconductor devices each having a reverse relatively constant potential breakdown characteristic between first and second terminals thereof, with their first terminals connected together at a first junction, each of said first devices being poled so that it is actuated and operates in its reverse breakdown condition upon application to its second terminal of a first potential individual thereto, said first OR circuit also including means connected to said first common junction for generating an output signal in response to the actuation of any first device, at least one first AND circuit for providing one of said first potentials, where said first AND circuit comprises a second semiconductor device having a reverse relatively constant potential breakdown characteristic between first and second terminals thereof with a first impedance connected in series with said first terminal of said second device to form a second junction therebetween, said first AND circuit also including a potential applied across said series combination with a polarity and magnitude such as to cause said second device to operate in its reverse breakdown condition to pass a current of maximum magnitude $I_D$ therethrough so as to generate a second potential at said second junction, said first AND circuit also including a group of N third semiconductor devices each having a reverse relatively constant potential breakdown characteristic between first and second terminals thereof with each being connected to said second junction by its first terminal and poled so that it is actuated and operates in its reverse breakdown condition upon application to its second terminal of a third potential individual thereto, so as to pass a current therethrough of magnitude I which is applied to said first impedance in the same direction as that of current $I_D$, where $I_D=(N-1)I$, in order that said second potential is produced at said second junction for any number of actuated third devices, up to and including $(N-1)$, and said first potential is produced at said second junction for a number of actuated third devices equal to N, means connecting said second junction of said first AND circuit to the second terminal of an individual one of said first devices, and at least one first circuit means connected to the second terminal of at least one said third device to provide said third potential thereto.

2. A logic circuit according to claim 1 in which each of said semiconductor devices is a silicon breakdown diode.

3. A logic circuit according to claim 2 in which the said first and second terminals of each diode are its anode and cathode, respectively.

4. A logic circuit according to claim 2 in which said output signal means comprises a transistor having one of its electrodes connected to said first junction, and an impedance connected to said first junction through which a biasing potential is applied thereto.

5. A logic circuit according to claim 4 in which said transistor is of the P-N-P type having its emitter electrode connected to said first junction, and in which the said first and second terminals of each diode are its anode and cathode, respectively.

6. A logic circuit according to claim 1 in which said first circuit means is a second OR circuit consisting of a second impedance having first and second terminals with a potential applied to its second terminal, said second OR circuit also including a group of fourth semiconductor devices each having a reverse relatively constant potential breakdown characteristic between first and second terminals thereof with each being connected by its first terminal to the first terminal of said second impedance to form a third junction thereat, and poled so that it is actuated and operates in its reverse breakdown condition, upon application to its second terminal of a fourth potential individual thereto, to apply a current of magnitude $I_O$ to said second impedance in a direction to produce said third potential at said third junction, means to connect the said third junction of said OR circuit to the second terminal of an individual one of said third devices, and a group of input means each individually connected to the second terminal of said fourth device to provide said fourth potential thereto.

7. A logic circuit according to claim 6 in which each of said semiconductor devices is a silicon breakdown diode.

8. A logic circuit according to claim 7 in which the said first and second terminals of each diode are its anode and cathode, respectively.

9. A logic circuit according to claim 7 in which said output signal means comprises a transistor having one electrode thereof connected to said first junction, an impedance also connected to said first junction through which a biasing potential is applied thereto, and each of said input means comprises a transistor having one electrode thereof connected to the second terminal of a respective one of said fourth devices, and an impedance also connected to said fourth device second terminal through which a biasing potential is applied thereto.

10. A logic circuit according to claim 9 in which said output transistor is of the P-N-P type having its emitter electrode connected to said first junction, each of said input transistors is of the P-N-P type having its collector electrode connected to said respective fourth device second terminal, and the said first and second terminals of each diode are its anode and cathode, respectively.

11. A logic circuit according to claim 6 in which said second OR circuit further includes a fifth semiconductor device having a reverse relatively constant potential breakdown characteristic between first and second terminals thereof with its said second terminal being connected to said third junction and its first terminal connected to a bias potential, with said fifth device being poled so that it is actuated and operates in its reverse breakdown condition when said third potential is produced at said third junction.

12. A logic circuit according to claim 11 in which each of said semiconductor devices is a silicon breakdown diode.

13. A logic circuit according to claim 12 in which the said first and second terminals of each diode are its anode and cathode, respectively.

14. A logic circuit according to claim 12 in which said output means comprises a P-N-P transistor having its emitter electrode connected to said first common junction, and an impedance also connected to said first common junction through which a biasing potential is applied thereto, each of said input means comprises a P-N-P transistor having its collector electrode connected to the second terminal of a respective said fourth device, an impedance also connected to said fourth device second terminal through which a biasing potential is applied thereto, and the said first and second terminals of each diode are its anode and cathode, respectively.

15. A logic circuit according to claim 1 in which said first circuit means is a second AND circuit which comprises a fourth semiconductor device having a reverse relatively constant potential breakdown characteristic between first and second terminals thereof and a second impedance connected in seriees with said first terminal of said fourth device to form a third junction therebetween, said second AND circuit also including a potential applied across said series combination with a polarity and magnitude such as to cause said fourth device to operate in its reevrse breakdown condition to pass a current of maximum magnitude $I_E$ therethrough so as to generate a fourth potential at said third junction, said second AND circuit also including a group of M input means each connected to said third junction and each individually selectively actuated to apply a current of magnitude $I_F$ to said second impedance in the same direction as that of current $I_E$, where $I_E=(M-1)I_F$, on order that said fourth potential is substantially produced at said third junction for any number of actuated input means, up to and including $(M-1)$, and said third potential is produced at said third junction for a number of actuated input means equal to M, and means to connect said third junction of said second AND circuit to the second terminal of an individual one of said third devices.

16. A logic circuit according to claim 15 in which each of said semiconductor devices is a silicon breakdown diode.

17. A logic circuit according to claim 16 in which the said first and second terminals of each diode are its anode and cathode, respectively.

18. A logic circuit according to claim 16 in which said output signal means comprises a transistor having one electrode thereof connected to said first junction, and an impedance also connected to said first junction through which a biasing potential is applied thereto, and each of said input means comprises a transistor having one electrode thereof connected to the said respective third junction.

19. A logic circuit according to claim 18 in which said output transistor is of the P-N-P type having its emitter electrode connected to said first junction, each of said input transistors is of the P-N-P type having its collector electrode connected to said third junction, and the said first and second terminals of each diode are its anode and cathode, respectively.

20. A logic circuit including: a first OR circuit comprising a group of first semiconductor diodes, each having a reverse relatively constant potential breakdown characteristic between first and second terminals thereof, with their first terminals connected together in a first junction, each of said first diodes being poled so that it is actuated and operates in its reverse breakdown condition upon application to its second terminal of a first potential individual thereto, said first OR circuit also including means connected to said first junction for generating an output signal in response to the actuation of any first diode, at least one first AND circuit for providing one of said first potentials, where said first AND circuit comprises a second semi-conductor diode having a reverse relatively constant potential break-down characteristic between first and second terminals thereof with a first impedance connected in series with said first terminal of said second diode to form a second junction therebetween, said first AND circuit also including a potential applied across said series combination with a polarity and magnitude such as to cause said second diode to operate in its reverse breakdown condition to pass a current of maximum magnitude $I_D$ therethrough so as to generate a second potential at said second junction, said first AND circuit also including a group of N third said semiconductor diodes each having a reverse relatively constant potental breakdown characteristic between first and second terminals thereof with each being connected to said second junction by its first terminal and poled so that it is actuated and operates in its reverse breakdown condition upon application to its second terminal of a third potential individual thereto so as to pass a current therethrough of magnitude I which is applied to said first impedance in the same direction as that of $I_D$, where $I_D=(N-1)I$, in order that said second potential is produced at said second junction for any number of actuated third diodes up to and including $(N-1)$, and said first potential is produced at said second junction for a number of actuated third diodes equal to N, means connecting said second junction of said first AND circuit to the second terminal of an individual one of said first diodes, at least one second OR circuit for providing one of said third potentials, where said second OR circuit comprises a second impedance having first and second terminals with a potential applied to its second terminal, said second OR circuit also including a group of fourth semiconductor diodes, each having a reverse relatively constant potential breakdown characteristic between first and second terminals thereof with each being connected by its first terminal to the first terminal of said second impedance to form a third junction thereat and poled so that it is actuated and operates in its reverse breakdown condition upon application to said second terminal of a fourth potential individual thereto, so as to pass a current therethrough of magnitude $I_O$ which is applied to said second impedance in a direction to produce said third potential at said third junction, means to connect the said third junction of said second OR circuit to the second terminal of an individual one of said third diodes, and a group of input means each individually connected to the second terminal of a said fourth diode to provide said fourth potential thereto.

21. A logic circuit according to claim 20 in which the said first and second terminals of each diode are its anode and cathode, respectively.

22. A logic circuit according to claim 20 in which said second OR circuit further includes a fifth semiconductor diode having a reverse relatively constant potential breakdown characteristic between first and second terminals thereof with its said second terminal being connected to said third junction and its first terminal connected to a bias potential, with said fifth diode being poled so that it is actuated and operates in its reverse breakdown condition when said third potential is producted at said third junction.

23. A logic circuit according to claim 22, in which the said first and second terminals of each diode are its anode and cathode, respectively.

24. A logic circuit including: a first OR circuit comprising a group of first semiconductor diodes, each having a reverse relatively constant potential breakdown characteristic between first and second terminals thereof, with their first terminals connected together in a first junction, each of said first diodes being poled so that it is actuated and operates in its reverse breakdown condition upon application to its second terminal of a first potential individual thereto, said first OR circuit also including means connected to said first junction for generating an output signal in response to the actuation of any first diode, at least one first AND circuit for providing one of said first potentials, where said first AND circuit comprises a second semiconductor diode having a reverse relatively constant potential breakdown characteristic between first and second terminals thereof with a first impedance connected in series with said first terminal of said second diode to form a second junction therebetwen, said first AND circuit also including a potential applied across said series combination with a polarity and magnitude such as to cause said second diode to operate in its reverse breakdown condition to pass a current of maximum magnitude $I_D$ therethrough so as to generate a second potential at said second junction, said first AND circuit also including a group of N third semiconductor diodes each having a reverse relatively constant potential breakdown characteristic between first and second terminals thereof with each being connected to said second junction by its first terminal and poled so that it is actuated and operates in its reverse breakdown condition upon application to its second terminal of a third potential individual thereto, so as to pass a current therethrough of magnitude I which is applied to said first impedance in the same direction as that of $I_D$, where $I_D=(N-1)I$, in order that said second potential is produced at said second junction for any number of actuated third diodes up to and including $(N-1)$, and said first potential is produced at said second junction for a number of actuated third devices equal to N, means connecting said second junction of said first AND circuit to the second terminal of an individual one of said first diodes, at least one second AND circuit for providing one of said third potentials, where said second AND circuit comprises a fourth semiconductor diode having a reverse relatively constant potential breakdown characteristic between first and second terminals thereof with a second impedance connected in series with said first terminal of said fourth diode to form a third junction therebetween, said second AND circuit also including a potential applied across said series combination with a polarity and magnitude such as to cause said fourth diode to operate in its reverse breakdown condition to pass a current of maximum magnitude $I_E$ therethrough so as to generate a fourth potential at said third junction, said second AND circuit also including a group of M input means each connected to said third junction and each individually selectively actuated to supply a current of magnitude $I_F$ to said second impedance in the same direction as that of current $I_E$ where $I_E$ equals $(M-1)I_F$, in order that said fourth potential is sustantially produced at said third junction for any number of actuated input means up to and including $(M-1)$, and said third potential is produced at said third junction for a number of actuated input means equal to M, and means to connect said third junction of said second AND circuit to the second terminal of an individual one of said third diodes.

25. A logic circuit according to claim 24 in which the said first and second terminals of each diode are its anode and cathode, respectively.

References Cited in the file of this patent

UNITED STATES PATENTS 2,712,065 Elbourn ---------------- June 28, 1955

FOREIGN PATENTS 598,597 Canada ---------------- May 24, 1960

1,057,171 Germany ---------------- May 14, 1955

OTHER REFERENCES

Applications of Silicon Junction Didoes, Cornell-Dubilier Elec. Corp., May 1957.